United States Patent
Oosawa

(10) Patent No.: US 8,344,763 B2
(45) Date of Patent: Jan. 1, 2013

(54) LOW-SPEED DRIVER CIRCUIT

(75) Inventor: Hiromitsu Oosawa, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 369 days.

(21) Appl. No.: 12/732,716

(22) Filed: Mar. 26, 2010

(65) Prior Publication Data

US 2010/0244909 A1   Sep. 30, 2010

(30) Foreign Application Priority Data

Mar. 27, 2009   (JP) ................. 2009-078472

(51) Int. Cl.
*H03B 1/00*   (2006.01)
(52) U.S. Cl. ............ 327/108; 327/112; 327/326; 327/83
(58) Field of Classification Search .......... 327/108–112, 327/179, 374–377, 379, 389, 391; 326/21–24, 326/26–27, 30, 82–83, 87; 330/258
See application file for complete search history.

(56) References Cited

U.S. PATENT DOCUMENTS

| 6,222,403 B1 | 4/2001 | Mitsuda |
| 2008/0197892 A1 | 8/2008 | Osawa |

FOREIGN PATENT DOCUMENTS

| JP | 11-346147 | 12/1999 |
| JP | 2003-309460 A | 10/2003 |
| JP | 2008-205768 A | 9/2008 |

*Primary Examiner* — Lincoln Donovan
*Assistant Examiner* — Shikha Goyal
(74) *Attorney, Agent, or Firm* — Arent Fox LLP

(57) ABSTRACT

A driver circuit includes an output transistor circuit that includes a first transistor of a first conductivity type and a second transistor of a second conductivity type disposed between a supply voltage source and a reference voltage source, and that outputs an output signal from a connection node between the first transistor and the second transistor, a first pre-buffer circuit that drives a gate of the first transistor in response to an input signal, and a second pre-buffer circuit that drives a gate of the second transistor in response to the input signal.

18 Claims, 13 Drawing Sheets

US 8,344,763 B2
1

LOW-SPEED DRIVER CIRCUIT

CROSS-REFERENCE TO RELATED APPLICATIONS

This application claims the benefit of priority from Japanese Patent Application No. 2009-78472 filed on Mar. 27, 2009, the entire contents of which are incorporated herein by reference.

BACKGROUND

1. Field

Embodiments discussed herein relate to driver circuits.

2. Description of Related Art

Rising through rate and falling through rate of a low-speed driver circuit are low and slow without dropping an output impedance. Rising and falling slopes of an output signal from the low-speed driver circuit may be gentle. The low-speed driver circuit may be also applied to output driver circuits, such as to a USB Device and I2C. The USB Device and I2C use communication standards to make the through rate of an output signal low, without dropping an output impedance of an output driver.

Related techniques are disclosed, for example, in Japanese Laid-open Patent Publication No. 2003-309460 and Japanese Laid-open Patent Publication No. 2008-205768.

SUMMARY

According to one aspect of the embodiments, a driver circuit is provided which includes: an output transistor circuit that includes a first transistor of a first conductivity type and a second transistor of a second conductivity type disposed between a supply voltage source and a reference voltage source and outputs an output signal from a connection node between the first transistor and the second transistor; a first pre-buffer circuit that drives a gate of the first transistor in response to an input signal; and a second pre-buffer circuit that drives a gate of the second transistor in response to the input signal. The first pre-buffer circuit includes: a third transistor of the first conductivity type and a fourth transistor of the second conductivity type that receive the input signal and drive the gate of the first transistor; a first current source disposed between the fourth transistor and the reference voltage source; and a fifth transistor of the first conductivity type in diode-coupled disposed between the supply voltage source and the third transistor. The second pre-buffer circuit includes: a sixth transistor of the first conductivity type and a seventh transistor of the second conductivity type that receive the input signal and drive the gate of the second transistor; a second current source disposed between the sixth transistor and the supply voltage source; and an eighth transistor of the second conductivity type in diode-coupled disposed between the reference voltage source and the seventh transistor.

Additional advantages and novel features of various aspects of the invention will be set forth in part in the description that follows, and in part will become more apparent to those skilled in the art upon examination of the following or upon learning by practice of the invention.

DESCRIPTION OF EMBODIMENTS

In a low-speed driver circuit, the through rate of a pre-buffer circuit for driving an output transistor is low. Since a current source for limiting a current to a given value is provided in a pre-buffer circuit for driving a gate of a CMOS output transistor at the final stage, rising and falling of an output signal from the pre-buffer circuit are performed at low speeds. Thus, the driving capability of the final stage CMOS output transistor, which is driven by the output signal from the pre-buffer circuit, is reduced and the through rate of the output signal becomes lower.

The current source of the pre-buffer circuit includes, for example, a Miller circuit. The current value of the current source may be varied, depending on a variation in threshold value of a transistor induced by a variation in process, for example and, thereby, the through rate of the pre-buffer circuit may be varied.

For example, in a driver circuit of a USB Device, a pair of driver circuits generate a differential signal and transfers the generated differential signal to a mating USB Device. The differential signal corresponds to an eye pattern defined based on a standard.

Figure 1:
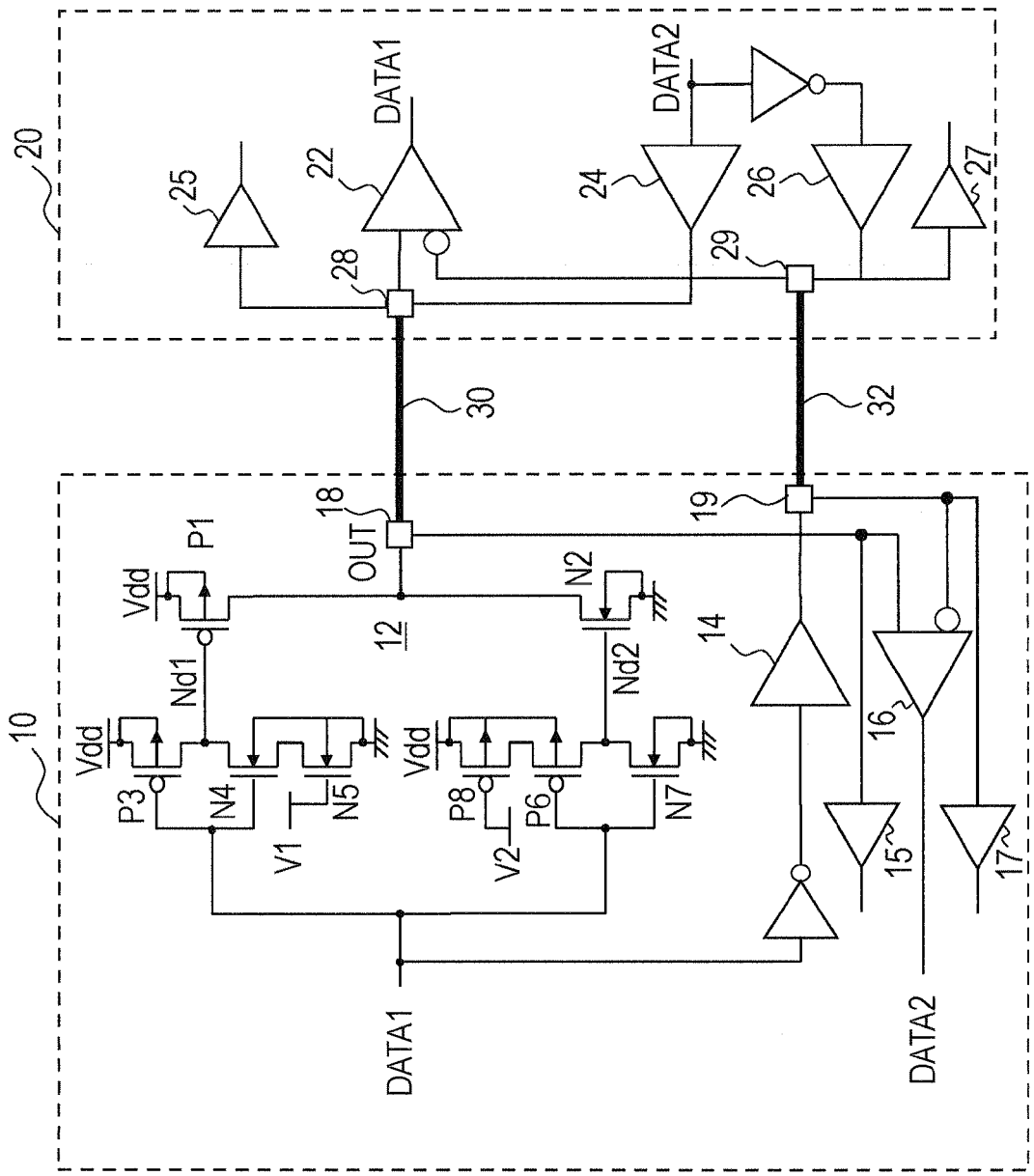
FIG. 1 illustrates an exemplary low-speed driver circuit.

FIG. 1 illustrates an exemplary low-speed driver circuit. The low-speed driver circuit illustrated in FIG. 1 may be applied to a USB Device. For example, a USB Device 10 on the side of a host computer and a USB Device 20 on the side of a peripheral device are coupled with each other via transmission lines 30 and 32. The USB Device 10 on the host computer side includes a pair of output driver circuits 12 and 14, a differential input buffer circuit 16 and input buffer circuits 15 and 17 for single-end signals. Input/output terminals 18 and 19 are respectively coupled to the transmission lines 30 and 32. The USB Device 20 on the peripheral device side includes a pair of output driver circuits 24 and 26, a differential input buffer circuit 22 and input buffer circuits 25 and 27 for single-end signals. Input/output terminals 28 and 29 are respectively coupled to the transmission lines 30 and 32.

The pair of output driver circuits 12 and 14 generate output signals, which have opposite phases, and output the output signals to the differential input buffer circuit 22. The pair of output driver circuits 24 and 26 respectively output output signals, which have opposite phases to each other, to the differential input buffer circuit 16. Signals are propagated bi-directionally via the transmission lines 30 and 32, a data signal DATA 1 is supplied from the host computer side to the peripheral device side, and a data signal DATA 2 is supplied from the peripheral device side to the host computer side.

Single-end signals are input into the input buffer circuits 15, 17, 25 and 27.

The output driver circuit 12 includes a P-channel transistor P1 and an N-channel transistor N2 and also includes a main driver circuit for outputting an output signal from a connection point between the transistors and pre-buffer circuits respectively driving gates of the P-channel transistor P1 and the N-channel transistor N2.

The pre-buffer circuit for driving a node Nd1 of the gate of the transistor P1 of the output driver circuit (hereinafter, interchangeably also referred to as the output transistor P1) includes a P-channel transistor P3 and an N-channel transistor N4 whose gates are common-coupled, and an N-channel transistor N5 whose gate is coupled to a given voltage V1. The transistor N5 may be a current source whose current value is limited to a given current value. The through rate of falling at the node Nd1 is limited due to the current source, so that a change in current amount of the transistor P1 is reduced, thereby transiently limiting the current amount.

The pre-buffer circuit for driving a node Nd2 of the gate of the transistor N2 of the output driver circuit (hereinafter, referred to as the output transistor N2) includes a P-channel transistor P6 and an N-channel transistor N7, the gates of each of which are common-coupled, and a P-channel transistor P8, the gate of which is coupled to a given voltage V2 source. The transistor P8 may be a current source for which the current value is limited to a given current value. The through rate of rising at the node Nd2 is limited due to the current source, so that a change in current amount of the transistor N2 is reduced, thereby transiently limiting the current amount. The configuration of the output driver circuit 14 of a phase opposite to that of the output driver circuit 12 may be substantially the same as or similar to that of the output driver circuit 12.

In the case that the data signal DATA 1 is at a high level, the nodes Nd1 and Nd2 change to a low level. Then, the transistor P1 is turned on, the transistor N2 is turned off and hence an output signal OUT at the input/output terminal 18 reaches a high level. As a result, an output signal at the input/output terminal 19 changes to an opposite-phase low level. The through rate of falling at the node Nd1 is reduced, due to the current source transistor N5, so that the current amount of the P-channel transistor P1 is transiently limited and the through rate of rising of the output signal OUT is reduced. On the other hand, the through rate of falling at the node Nd2 is increased and the corresponding signal steeply falls.

In the case that the data signal DATA is at a low level, the nodes Nd1 and Nd2 change to a high level. Thus, the transistor P1 is turned off, the transistor N2 is turned on and hence the output signal OUT changes to a low level. Since the through rate of rising at the node Nd2 is low, the current amount of the transistor N2 is transiently limited, and the through rate of falling of the output signal OUT is reduced. The through rate of rising at the node Nd1 is increased.

An output driver circuit applied to the I2C may or may not include an output driver circuit, including the transistor P1 and the transistors P3, N4 and N5 illustrated in FIG. 1. The input/output terminal 18 serves as an open drain. The transmission line 30 may be coupled to a high supply voltage Vdd source via a pull-up resistor, for example. The output transistor P1 illustrated in FIG. 1 may be controlled to be turned off. An output driver circuit, applied to the I2C includes an output driver circuit including the transistor N2 and the transistors P8, P6 and N7. A change in current amount for the transistor N2 is reduced, and the current amount is transiently limited.

Figure 2:
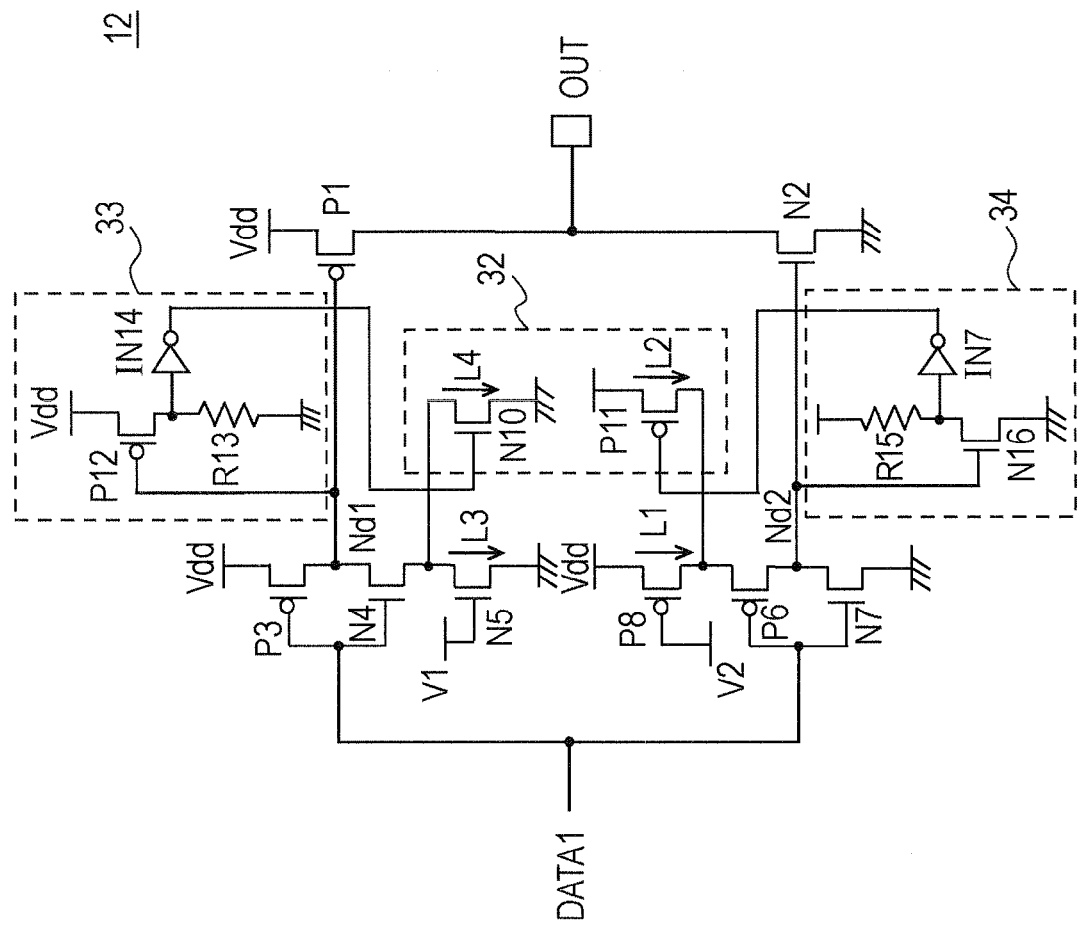
FIG. 2 illustrates an exemplary output driver circuit.

FIG. 2 illustrates an exemplary output driver circuit. The pre-buffer circuit, including the transistors P3, N4 and N5 for driving the node Nd1, includes an auxiliary N-channel transistor N10, so that the rate at which the potential at the node Nd1 falls from the supply voltage Vdd to a voltage Vdd−Vthp (Vthp denotes a threshold value of the P-channel transistor P1) is increased. A detection circuit 33 is provided, which detects that the potential at the node Nd1 has reached the voltage Vdd−Vthp, and, upon detection, turns the auxiliary transistor N10 off.

Figure 3:
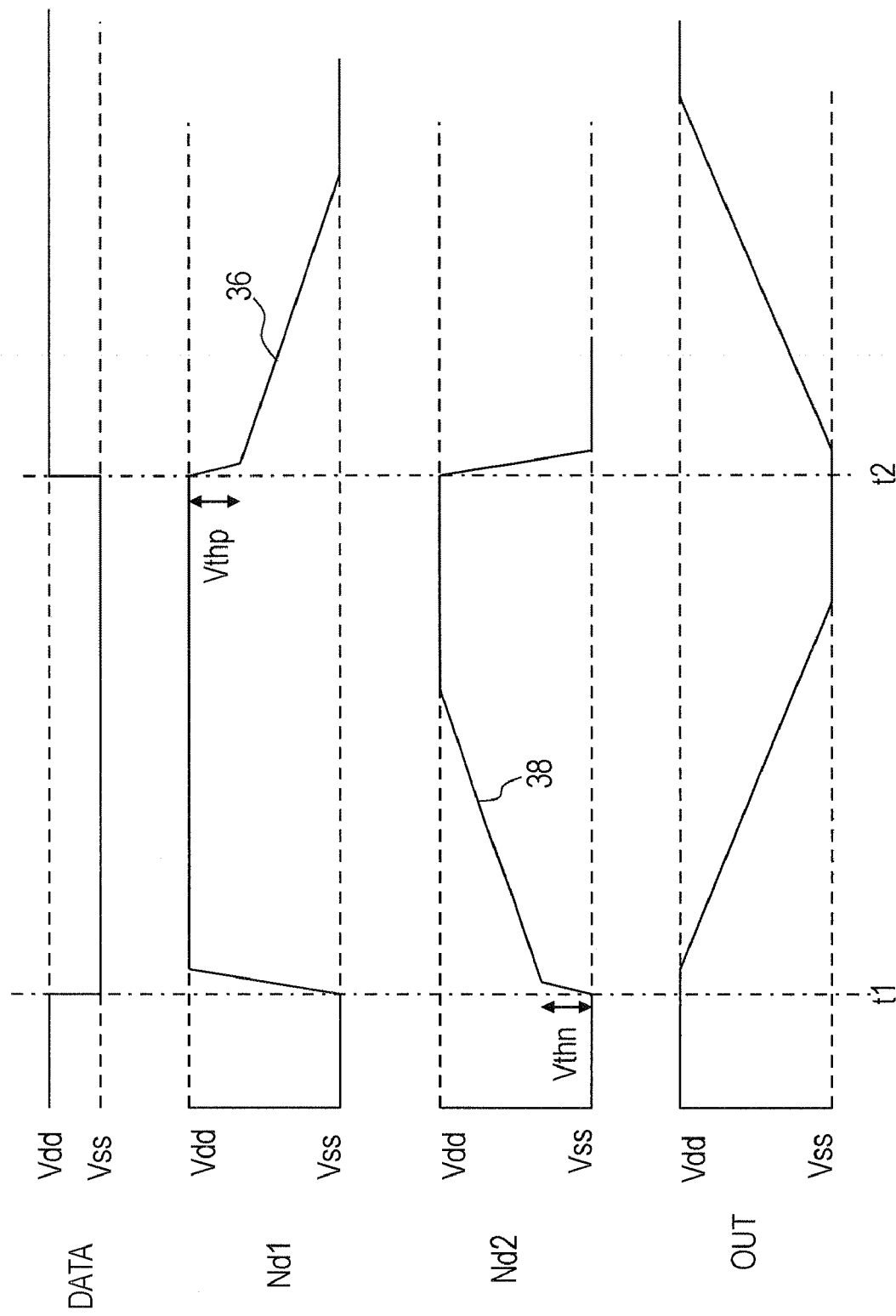
FIG. 3 illustrates exemplary operations of an output driver circuit.

FIG. 3 illustrates exemplary operations of an output driver circuit. The operations illustrated in FIG. 3 may be performed by the output driver circuit illustrated in FIG. 2, for example.

Figure 4:
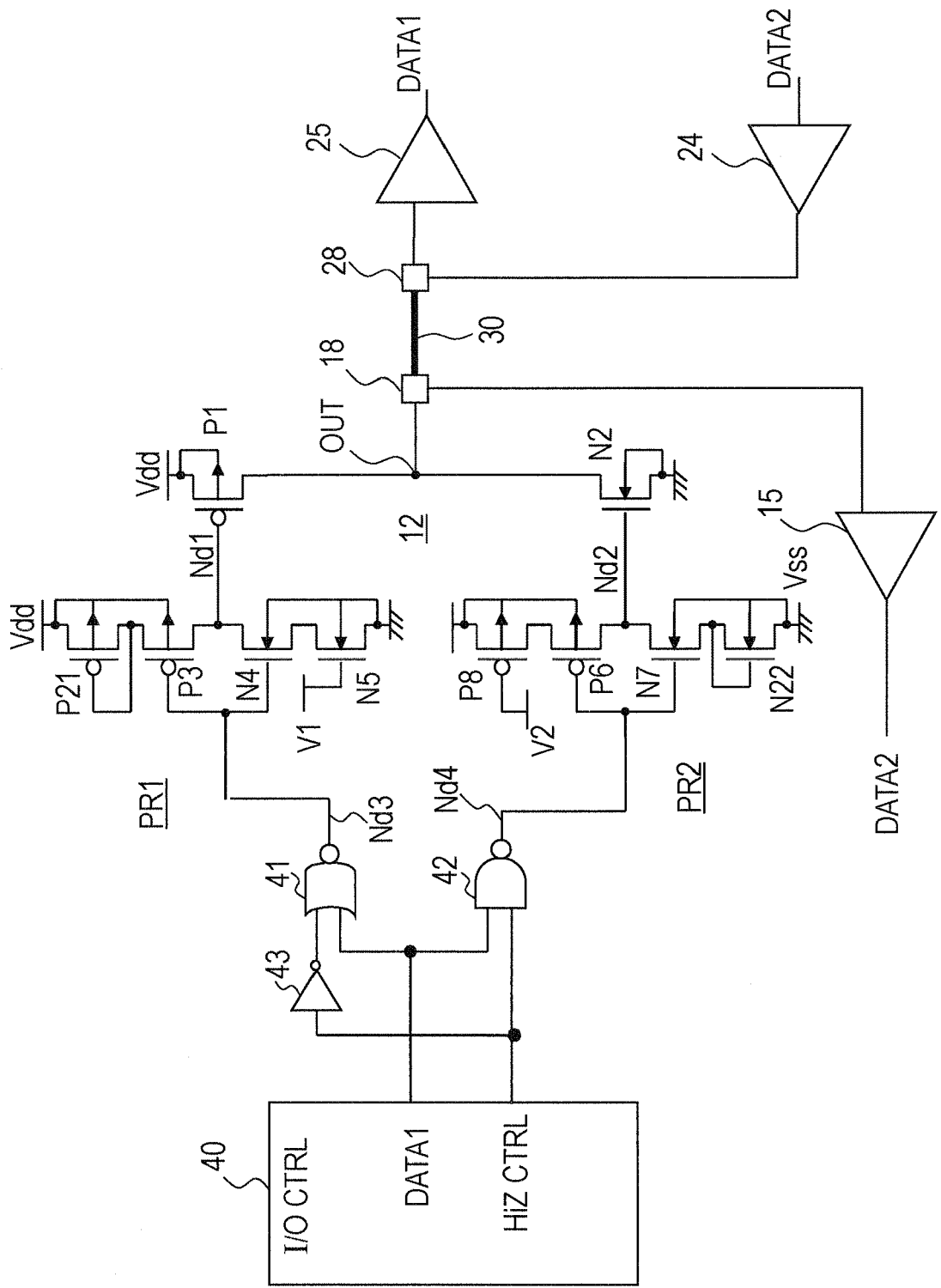
FIG. 4 illustrates an exemplary output driver circuit.

FIG. 4 illustrates an exemplary output driver circuit. The output driver circuit 12 illustrated in FIG. 4 may be applied to a driver for a bus, for example. The relation among the output driver circuits 12 and 26, the input buffer circuits 25 and 15, the input/output terminals 18 and 28 and the transmission line 30 may be substantially the same as or similar to that illustrated in FIG. 1.

The output driver circuit 12 includes a first P-channel transistor Pb and a second N-channel transistor N2, disposed between the supply voltage Vdd source and a reference voltage Vss source and arranged in series, and also includes an output transistor circuit having an output terminal OUT at a connection point between the first and second transistors, a first pre-buffer circuit for driving the node Nd1 of the gate of the first P-channel transistor P1, and a second pre-buffer circuit for driving the node Nd2 of the gate of the second N-channel transistor N2.

A first pre-buffer circuit PR1 includes a third P-channel transistor P3 and a fourth N-channel transistor N4 for driving the node Nd1 of the gate of the first P-channel transistor P1 with the data signal DATA1, which is supplied to the gate thereof via an NOR gate 41, the current source transistor N5 disposed between the fourth N-channel transistor N4 and the reference voltage Vss source, and a fifth P-channel transistor P21, which is diode-coupled between the supply voltage Vdd source and the third P-channel transistor P3.

A second pre-buffer circuit PR2 includes a sixth P-channel transistor 96 and a seventh N-channel transistor N7 for driving the node Nd2 of the gate of the second N-channel transistor N2 with the data signal DATA2, which is supplied to the gate thereof via a NAND gate 42, the current source transistor P8 disposed between the sixth P-channel transistor P6 and the supply voltage Vdd source, and an eighth N-channel transistor N22, which is diode-coupled between the reference voltage Vss source and the seventh N-channel transistor 7.

Because of the diode-coupled P-channel transistor P21, the potential at the node Nd1 is limited to a value between a voltage Vdd−Vthp and the voltage Vss. Thus, the operation of rapidly lowering the potential at the node Nd1 from the supply voltage Vdd to the voltage Vdd−Vthp may not be utilized. Because of the diode-coupled N-channel transistor N22, the potential at the node Nd2 is limited to a value between the voltage Vdd and a voltage Vss+Vthn. Thus, the operation of rapidly raising the potential at the node Nd2 from the reference voltage Vss to the voltage Vss+Vthn may be prevented.

Figure 5:
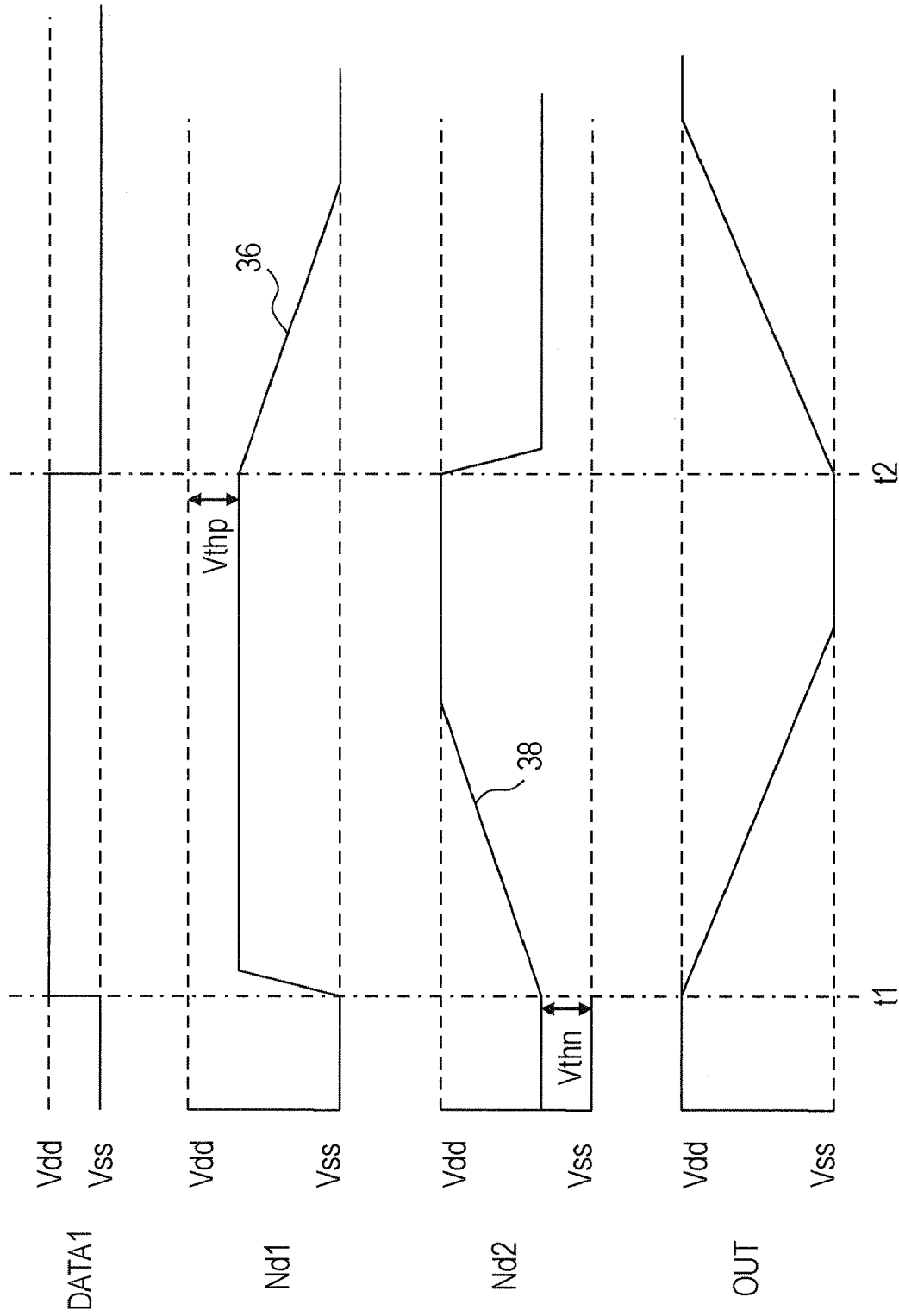
FIG. 5 illustrates exemplary operations of an output driver circuit.

FIG. 5 illustrates exemplary operations of an output diver circuit. The operations illustrated in FIG. 5 may be performed by the output driver circuit illustrated in FIG. 4 for example. Because of the NOR gate 41 and the NAND gate 42, the polarity of the data signal DATA1 illustrated in FIG. 5 is opposite to that of the data signal illustrated in FIG. 3. Because of the diode-coupled transistor P21, the potential at the node Nd1 is limited to between the voltage Vdd−Vthp and the voltage Vss. Thus, variation in a falling characteristic 36 at the node Nd1 may be limited. Because of the diode-connected transistor N22, the potential at the node Nd2 is limited between the voltage Vdd and the voltage Vss+Vthn. Thus, variation in a rising characteristic 38 at the node Nd2 may be limited.

Since channels and sources of the output transistor P1 and the diode-coupled transistor P21 are coupled to the supply voltage Vdd source, the output driver circuit 12 operates with a V-I characteristic (a relational characteristic of a drain current Id relative to a gate voltage Vg). The threshold voltage Vthp of the transistor may be varied in substantially the same direction. Thus, the node Nd1 is held at the voltage Vdd−Vthp for a time period t1 to t2, and hence the output transistor P1 changes to a non-conductive state. Then, the output transistor P1 changes to a conductive state in response to the falling characteristic 36 at the node Nd1 after the time t2.

Since channels and sources of the output transistor N2 and the diode-coupled transistor N22 are coupled to the reference voltage Vss source, the output driver circuit 12 operates with the V-I characteristic. The threshold voltage Vthn of the transistor may be varied. Thus, the node Nd2 is held at the voltage Vss+Vthn before the time t1 and after the time t2, and hence the output transistor N2 changes to a non-conductive state. Then, the output transistor N2 changes to a conductive state in response to the rising characteristic 38 at the node Nd2 after the time t1.

In the output driver circuit illustrated in FIG. 4, an influence on variation in manufacture of transistors and resistors caused by the operations that the output transistors P1 and N2 turn from the non-conductive states to the conductive states may be reduced.

An input/output controller 40 outputs the output data signal DATA1 and a high impedance control signal HiZ_CTRL. When the high impedance control signal HiZ_CTRL is at a low level, an output node Nd3 of the NOR gate 41 changes to a low level and an output node Nd4 of the NAND gate 42 reaches a high level regardless of the level of the data signal DATA1. When the node Nd1 reaches a high level, the node Nd2 turns to a low level, the output transistors P1 and N2 are turned off and the output signal OUT turns to a high-impedance state. The output driver circuit 12 turns to a disabled state after changing the output signal OUT to the high-impedance state. In the above mentioned state, a signal is transmitted from the output driver circuit 26 of the mating USB Device to the differential input buffer circuit 16.

When the high impedance control signal HiZ_CTRL is at a high level, the output transistors P1 and N2 are controlled depending on the level of the data signal DATA1. The output driver circuit 12 changes to a driving state for driving the output signal OUT. When the output driver circuit is in the driving state, the output from the output driver circuit 26 of the mating USB Device turns to a high-impedance state.

When the output from the output driver circuit 12 is at a high impedance, the potential at the node Nd1 reaches the voltage Vdd−Vthp and the potential at the node Nd2 reaches the voltage Vss+Vthn because of the diode-coupled transistors P21 and N22. Thus, the output transistors P1 and N2 may not be completely turned off.

Figure 6:
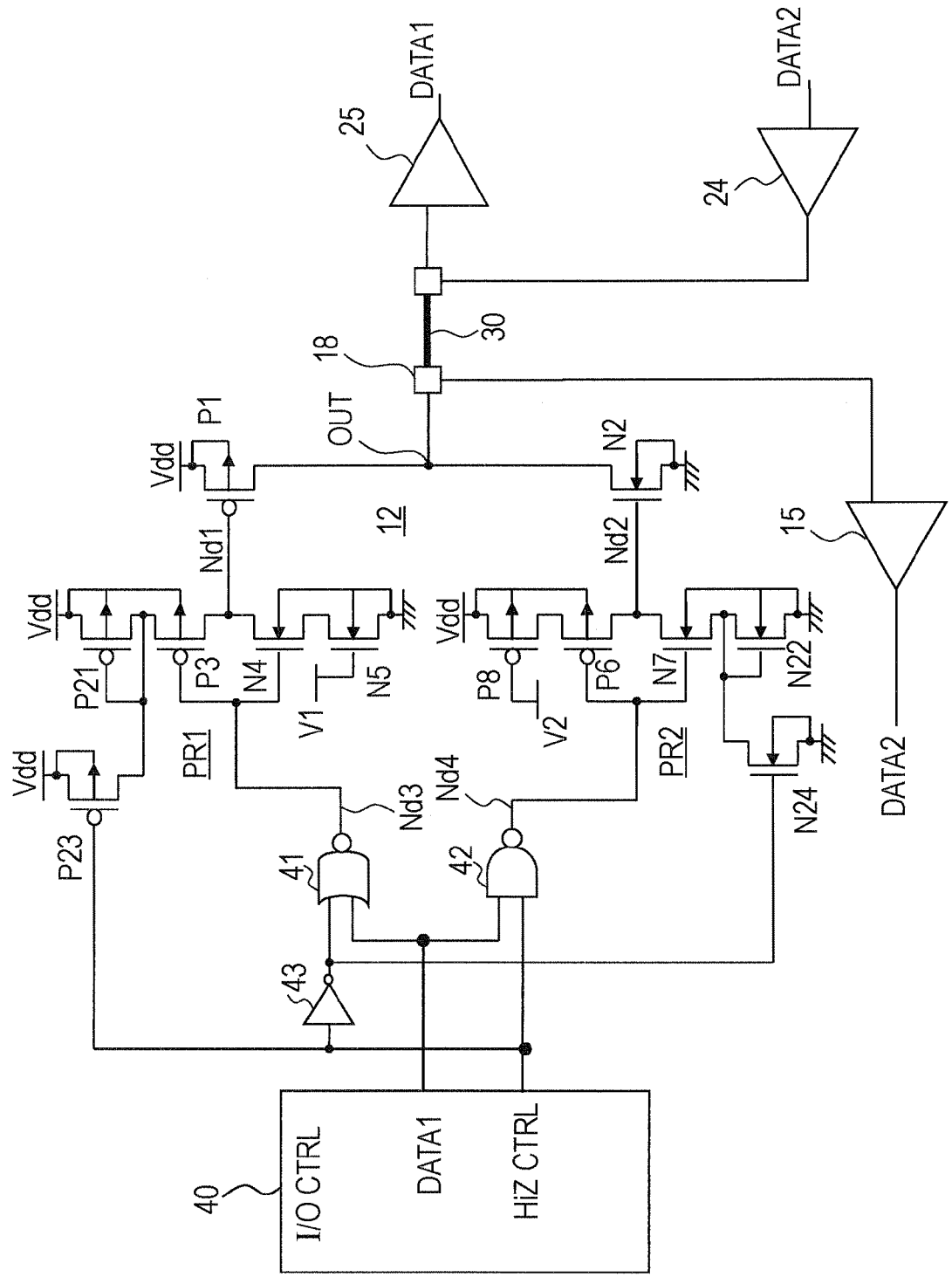
FIG. 6 illustrates an exemplary output driver circuit.

FIG. 6 illustrates an exemplary output driver circuit. The output driver circuit 12 illustrated in FIG. 4 includes a P-channel transistor P23, which is disposed in parallel with the diode-coupled transistor P21 and controlled by the high impedance control signal HiZ_CTRL, and an N-channel transistor N24, which is disposed in parallel with the diode-connected transistor N22 and controlled by an inverted signal of the high impedance control signal HiZ_CTRL. In a high-impedance state, the transistors P23 and N24 are turned on to set the nodes Nd1 and Nd2 respectively to the supply voltage Vdd and the reference voltage Vss. As a result, the output transistors P1 and N2 may be completely turned off. The transistors P23 and N24 are turned off when the output driver circuit is in the driving state.

Figure 7:
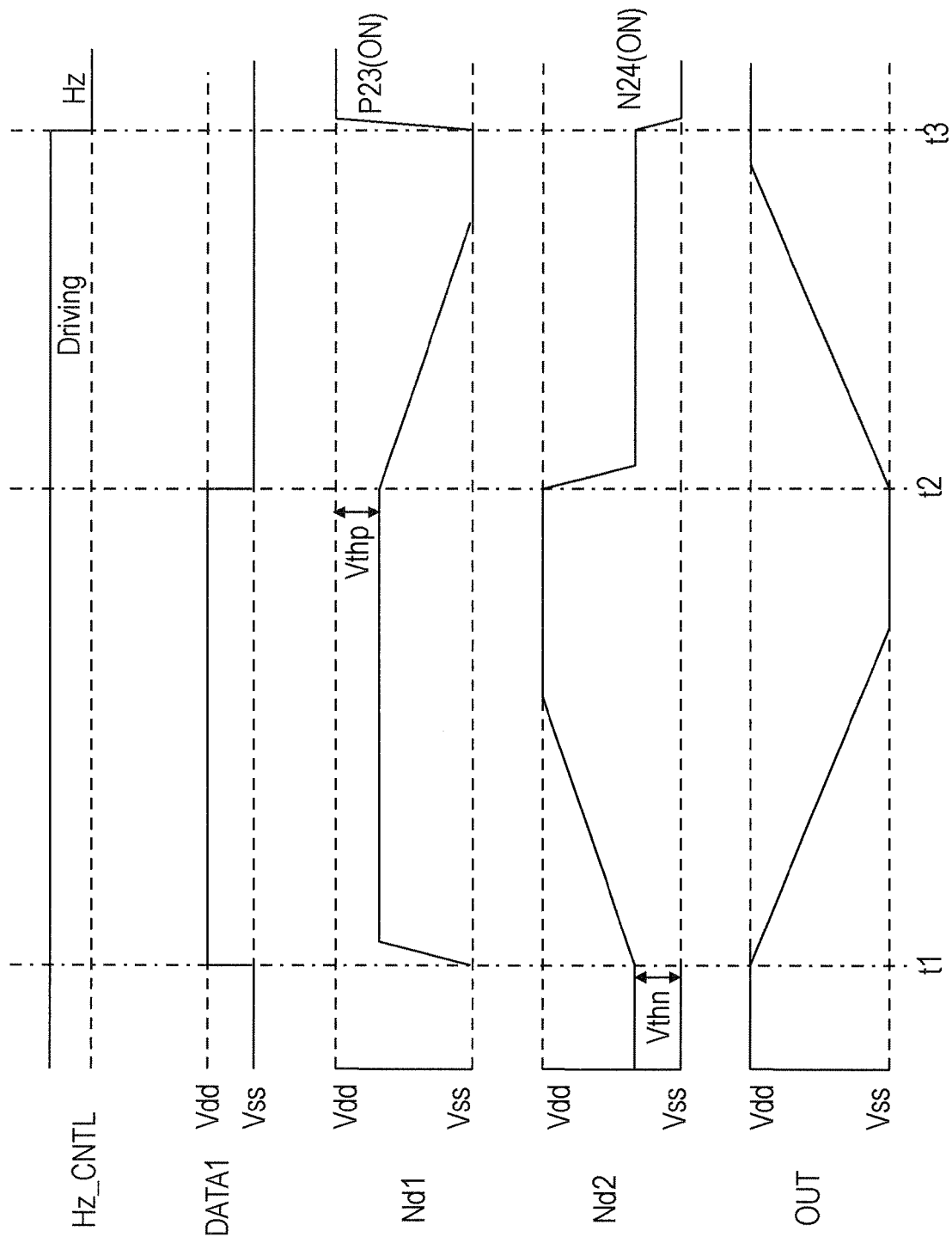
FIG. 7 illustrates exemplary operations of an output driver circuit.

FIG. 7 illustrates exemplary operations of an output driver circuit. The operations illustrated in FIG. 7 may be performed by the output driver circuit illustrated in FIG. 6, for example. Operations performed at the times t1 and t2 illustrated in FIG. 7 may be substantially the same as or similar to those illustrated in FIG. 5. At a time t3, the high impedance control signal HiZ_CTRL changes to a low level, and the output driver circuit 12 changes from a driving state to a high-impedance state. At the time t3, in response to the low level of the high impedance control signal HiZ_CTRL, the transistors P23 and N24 are turned on, the potential at the node Nd1 rises up to the supply voltage Vdd and the potential at the Node Nd2 decreases to the reference voltage Vss. Thus, the output transistors P1 and N2 may be completely turned off.

In the output driver circuit illustrated in FIG. 6, because of the transistors P23 and N24 respectively disposed in parallel with the diode-coupled transistors P21 and N22, operation in the high impedance state may be improved.

In the operation of the output driver circuit 12 illustrated in FIG. 7, when the output driver circuit changes from the high-impedance state to the driving state, the potential at the node Nd1 changes from the supply voltage Vdd to the voltage Vdd−Vthp or the potential at the node Nd2 changes from the reference voltage Vss to the voltage Vss+Vthn. The node for which the potential changes is determined based on the direction in which the level of the output data signal DATA1 is switched. In the driving state, the high impedance control signal HiZ_CTRL reaches a high level and the transistors P23 and N24 are turned off. Thus, the potential at the node Nd1 may not decrease to the voltage Vdd−Vthp and the potential at the node Nd2 may not increase to the voltage Vss+Vthn.

When the output data signal is changed first after switching from the high-impedance state to the driving state, a time period for transition of the node Nd1 from the supply voltage Vdd to the voltage Vdd−Vthp or a time period for transition of the node Nd2 from the reference voltage Vss to the voltage Vss+Vthn may induce a delay in transition start time of the output signal OUT. The transition times of the potentials at the nodes Nd1 and Nd2 may be varied via a variation in characteristics of the current source transistor, and hence the transition start time of the output signal OUT may be varied.

Figure 8:
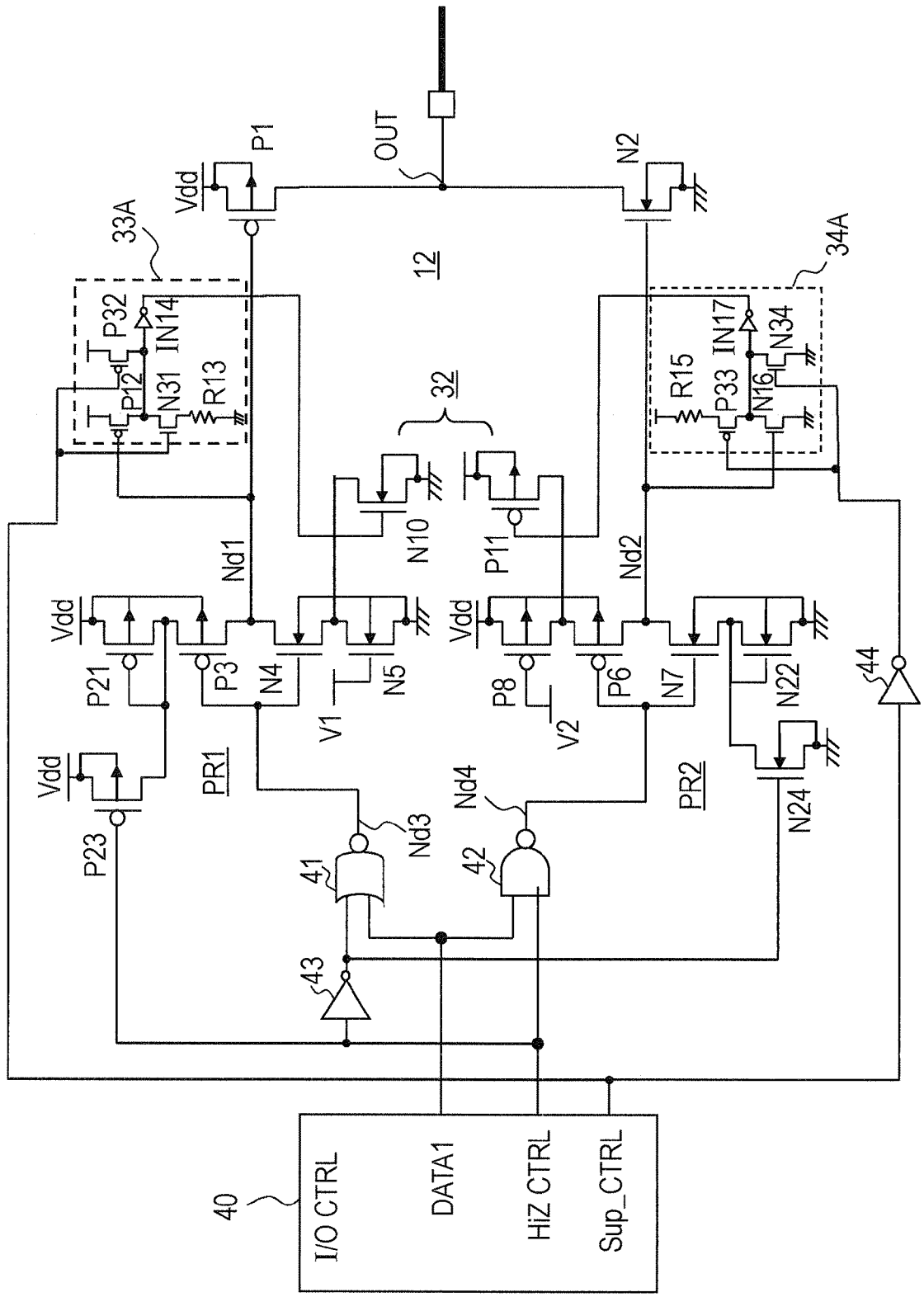
FIG. 8 illustrates an exemplary output driver circuit.

FIG. 8 illustrates an output driver circuit. Inappropriate operations occurring when the output data signal is first changed after switching from the high-impedance state to the driving state may be improved through the use of such a circuit.

The output driver circuit 12 illustrated in FIG. 8 includes an auxiliary circuit 32 including the auxiliary transistors N10 and P11 and detection circuits 33A and 33B for controlling the auxiliary transistors N10 and P11, in addition to the configuration of the output driver circuit illustrated in FIG. 6. The pre-buffer circuit PR1 for driving the node Nd1 of the gate of the output transistor P1 includes the auxiliary transistor N10, which is disposed in parallel with the current source transistor N5 for controlling the through rate of potential falling at the node Nd1, and the detection circuit 33A for controlling the gate of the auxiliary transistor N10. The detection circuit 33A includes transistors P32 and N31, which are controlled by an auxiliary circuit control signal Sup_CTRL, in addition to a transistor P12, a resistor R13 and an inverter IN14 included in the detection circuit illustrated in FIG. 2.

In the case that the auxiliary circuit control signal Sup_CTRL is in a disabled state, for example, at a low level, the transistors P32 and N31 are respectively turned on and off to produce an output from the inverter IN14 to a low level and to turn the auxiliary transistor N10 off. On the other hand, in the case that the auxiliary circuit control signal Sup_CTRL is in an enabled state, for example, at a high level, the transistors P32 and N31 are respectively turned off and on. If the node Nd1 is at a high level, the transistor P12 is turned off and the output from the inverter IN14 reaches a high level, so that the auxiliary transistor N10 is turned on and potential falling at the node Nd1 is performed at a high speed. When the potential at the node Nd1 reaches the voltage Vdd−Vthp, the transistor P12 is turned on, the output from the inverter IN14 changes to a low level, and the auxiliary transistor N10 is turned off. The ON-state current of the transistor P12 is larger than the current through the transistor N31 and the resistor R13, so that the output from the inverter IN14 changes to the low level.

The pre-buffer circuit PR2 for driving the node Nd2 of the gate of the output transistor N2 includes the auxiliary transistor P11 disposed in parallel with the current source transistor P8 for controlling the through rate of potential rising at the node Nd2 and a detection circuit 34A for controlling the gate of the auxiliary transistor P11. The detection circuit 34A includes transistors P33 and N34, controlled by the auxiliary circuit control signal Sup_CTRL, in addition to a transistor N16, a resistor R15 and an inverter IN17 of the detection circuit illustrated in FIG. 2.

The auxiliary transistor P11 and the detection circuit 34A operate oppositely to the pre-buffer circuit PR1. When the auxiliary circuit control signal Sup_CTRL is in the disabled state, for example, at the low level, an inverter 44 turns the transistor P33 off and turns the transistor N43 on, changes the output from the inverter IN17 to a high level and turns the auxiliary transistor N10 off. On the other hand, when the auxiliary circuit control signal Sup_CTRL is in the enabled state, for example, at the high level, the inverter 44 turns the transistor P33 on and turns the transistor N34 off. When the node Nd2 is at a low level, the transistor N16 is turned off, the output from the inverter N14 changes to a low level and the auxiliary transistor P11 is turned on. As a result, potential rising at the node Nd2 is performed at a high speed. When the potential at the node Nd2 reaches the voltage Vss+Vthn, the transistor N16 is turned on, the output from the inverter IN17 reaches a high level and the auxiliary transistor P11 is turned off. The ON-state current of the transistor N16 is larger than the current through the transistor P33 and the resistor R15, so that the output from the inverter IN17 changes to the high level.

The resistors R13 and R15 may include a current Miller circuit, for which a gate is coupled to a given voltage source, for example, as in the case of the current source transistors N5 and P8. Because of the characteristics of current Miller circuits, currents of desired amounts flow through the resistors R13 and R15. A current Miller circuit such as the one disclosed, for example, in Japanese Laid-open Patent Publication No. 2008-205768, may be used.

Figure 9:
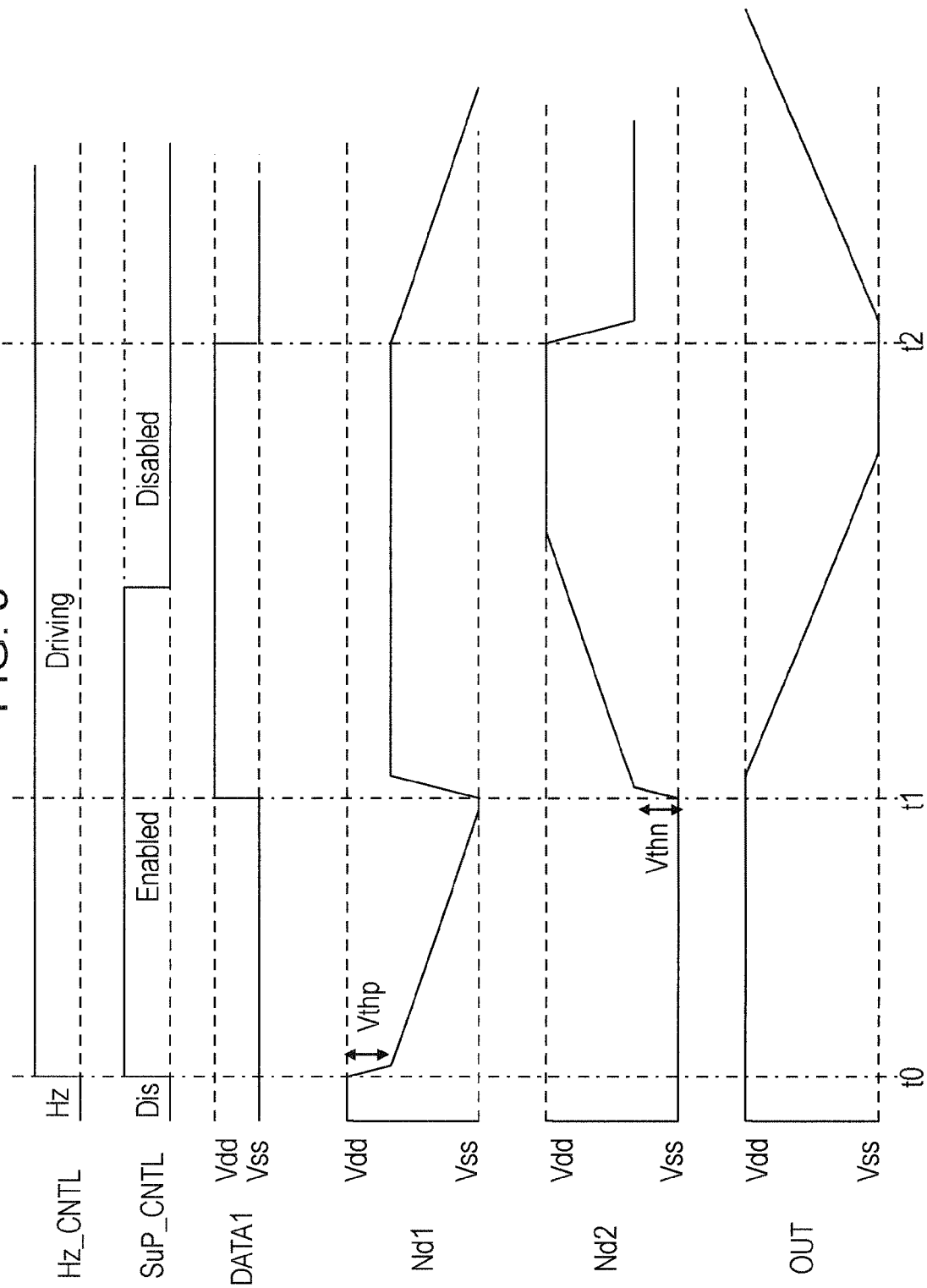
FIG. 9 illustrates exemplary operations of an output driver circuit.
Figure 10:
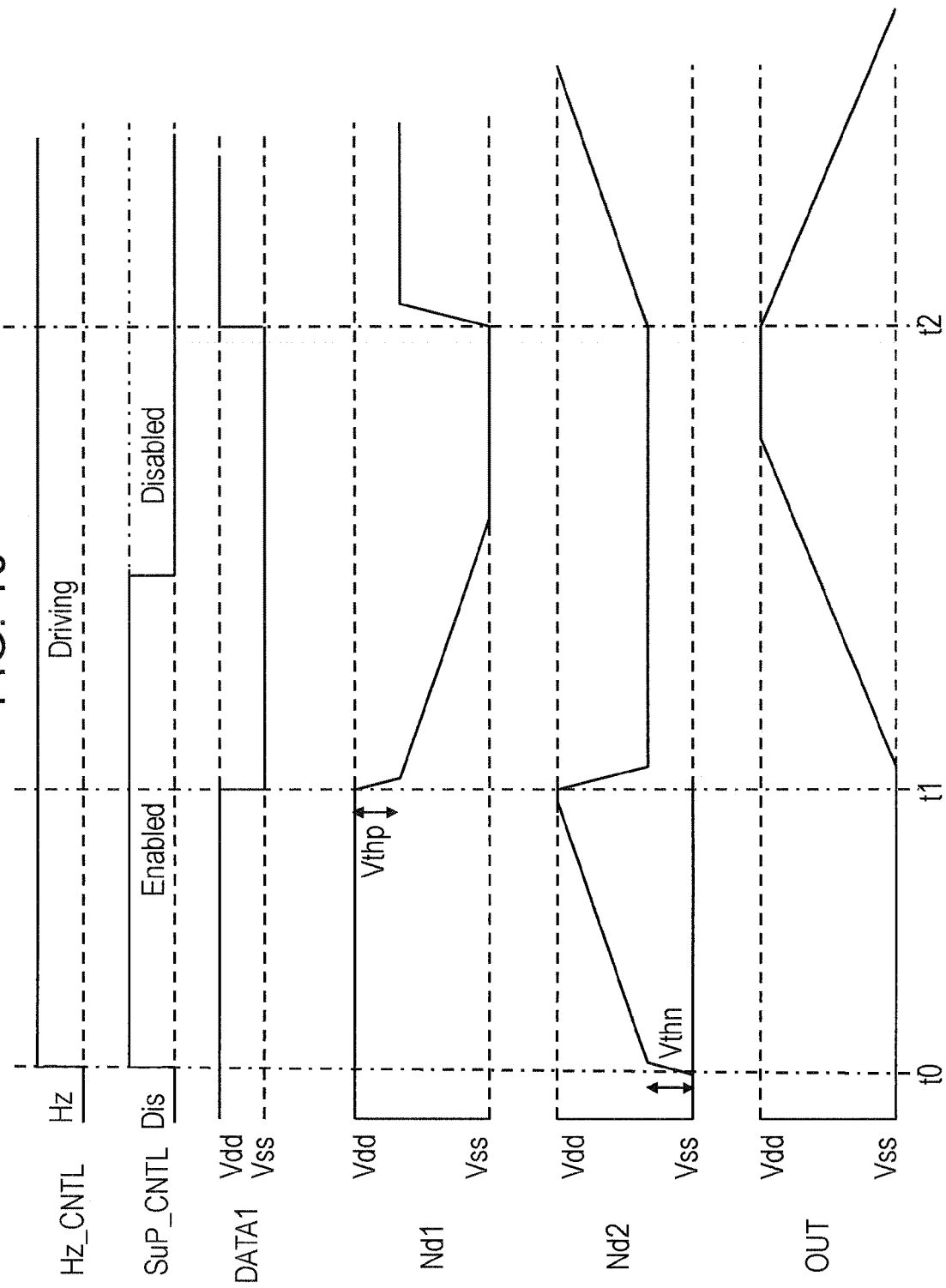
FIG. 10 illustrates exemplary operations of an output driver circuit.

FIGS. 9 and 10 illustrate exemplary operations of an output driver circuit. The operations illustrated in FIGS. 9 and 10 may be performed by the output driver circuit illustrated in FIG. 8, for example. At a time t0, the high impedance control signal HiZ_CTRL changes from a low level indicative of a high-impedance state to a high level indicative of a driving state. As illustrated in FIG. 9, the output data signal DATA1 switches from a low level to a high level at the time t1 and then switches from the high level to the low level at the time t2. As illustrated in FIG. 10, the output data signal DATA1 switches from a high level to a low level at the time t1 and switches from the low level to the high level at the time t2.

The auxiliary circuit control signal Sup_CTRL may be set to an enabled state, for example, at a high level, regardless of whether the output driver circuit is in a high-impedance state or in a driving state (1). The auxiliary circuit control signal Sup_CTRL may be set to a disabled state, for example, at a low level in the high-impedance state, and may be set to the enabled state, for example, at the high level in the driving state (2). The auxiliary circuit control signal Sup_CTRL may be set to the disabled state, for example, at the low level in the high-impedance state, and may be set to the enabled state, for example, at the high level, up to the time t1, at which time the output data signal is first switched, and thereafter may be set to the disabled state, for example, at the low level in the driving state (3). In FIGS. 9 and 10, the auxiliary circuit control signal Sup_CTRL in the condition (3) is illustrated.

In FIG. 9, in a high impedance state exhibited before the time t0, the high impedance control signal HiZ_CTRL is at the low level, and the auxiliary circuit control signal Sup_CTRL is in the disabled state, for example, at the low level. In this state, the transistors N31 and P33 of the detection circuit 33A are turned off, and a current through the transistors P12 and N31 and the resistor R13, as well as current through the resistor 15 and the transistors P33 and N16 are cut off, hence, no current is consumed.

When the state is switched from the high impedance state to the driving state at the time t0, the high impedance control signal HiZ_CTRL is set at the high level and the auxiliary circuit control signal Sup_CTRL is set to the enabled state, for example, at the high level. Thus, the transistors P23 and N41 are turned off, and the detection circuits 33A and 34A change to the enabled states.

When the data signal DATA1 is at a low level, the node Nd3 reaches a high level, and the pre-buffer circuit PR1 lowers the potential at the node Nd1 from the supply voltage Vdd. Since the detection circuit 33A is in the enabled state, the output from the inverter IN14 is set at a high level, in accordance with the high level of the node Nd1, the auxiliary transistor N10 is turned on and the current source transistor N5 is turned on. As a result, the potential at the node Nd1 rapidly falls from the supply voltage down to the voltage Vdd−Vthp, and then falls at a low through rate with the ON-state current of the current source transistor N5.

On the side of the pre-buffer circuit PR2, since the data signal DATA1 is at a low level, the node Nd4 is at a high level, and the potential at the node Nd2 is held at the reference voltage Vss. On the side of the detection circuit 34A, the output from the inverter 44 is at a low level, the transistor P33 is turned on, and the output from the inverter IN17 changes to a low level, so that the auxiliary transistor P11 may be turned on.

When the data signal DATA1 is switched from a low level to a high level at the time t1, on the side of pre-buffer circuit PR2, the node Nd4 turns to a low level, and the transistor P6 is turned on. The potential at the node Nd2 rapidly rises from the reference voltage Vss up to the voltage Vss+Vthn with the ON-state currents from the current source transistor P8 and the auxiliary transistor P11. When the potential at the node Nd2 reaches the voltage Vss+Vthn, the transistor N16 is turned on, the output from the inverter IN17 reaches a high level, and the auxiliary transistor P11 is turned off. Then, the potential at the node Nd2 rises at a low through rate with the ON-state current of the current source transistor P8.

On the side of the pre-buffer circuit PR1, the potential at the node Nd1 rapidly rises to the voltage Vdd−Vthp with the currents from the transistors P21 and P3.

After the level of the data signal DATA1 has been switched at time 1, the level of the potential at the node Nd1 goes up and down between the voltage Vdd−Vthp and the voltage Vss, and the level of the potential at the node Nd2 goes up and down between the voltage Vss+Vthn and the voltage Vdd. The auxiliary circuit control signal Sup_CNTL is set to a disabled state, for example, at a low level after the time t1. Therefore, in the detection circuits 33A and 34A, the transistors N31 and P33 are turned off and currents passing through the detection circuits are cut off. Thus, the output from the inverter IN14 changes to a low level and the auxiliary transistor N10 is turned off, and the output from the inverter IN17 reaches a high level and the auxiliary transistor P11 is turned off. Thus, the auxiliary circuit 32 changes to a disabled state.

At the time t2, the data signal DATA1 is switched again from the high level to the low level. The operations at the time t2 may be substantially the same as or similar to those at the time t2 illustrated in FIG. 7.

When the currents passing through the detection circuits 33A and 34A do not induce any problem in a driving state, the auxiliary circuit control signal Sup_CTRL may be held in an enabled state, for example, at a high level based on the above mentioned condition (2). In the driving state, the potential at the node Nd1 rises up to the voltage Vdd−Vthp because of the diode-coupled transistor P21 on the side of the pre-buffer circuit PR1, and hence the transistor P12 is kept turned on. The output from the inverter IN14 is held at a low level, and the auxiliary transistor N10 turns to an almost inoperative state. The potential at the node Nd2 decreases to the voltage Vss+Vthn because of the diode-coupled transistor N22 on the side of the pre-buffer circuit PR2, so that the transistor N16 is kept turned on and the auxiliary transistor P11 turns to an almost inoperative state.

In FIG. 10, the data signal DATA1 is at a high level at the time t0. The data signal DATA1 is switched from the high level to a low level at the time t1 and then switched from the low level to the high level at the time t2. Operations of the pre-buffer circuits PR1 and PR2 are opposite to those in FIG. 9. In FIG. 10, when switching from a high-impedance state to a driving state at the time t0, the auxiliary circuit control signal Sup_CTRL changes from a disabled state to an enabled state, for example, to a high level. In response to the change, on the side of the pre-buffer circuit PR2, the potential at the node Nd2 rapidly rises from the reference voltage Vss up to the voltage Vss+Vthn and then rises at a low through rate. When the data signal DATA1 is switched from the high level to the low level at the time t1, on the side of the pre-buffer circuit PR1, the potential at the node Nd1 rapidly falls from the supply voltage Vdd down to the voltage Vdd−Vss and then falls at a low through rate.

After the time t1, even if the auxiliary circuit control signal Sup_CTRL turns to a disabled state, for example, to a low level and the auxiliary transistors N10 and P11 turns off, the potential at the node Nd1 will go up and down between the voltage Vdd−Vthp and the voltage Vss, and the potential at the node Nd2 will also go up and down between the voltage Vdd and the voltage Vss+Vthp because of the diode-coupled transistors P21 and N22.

In the driving state, the auxiliary circuit control signal Sup_CTRL may be held in an enabled state, for example, at a high level. Currents may pass through the detection circuits 33A and 34A.

Based on the above mentioned condition (1), the detection circuit 33A and 34A may be held in enabled states. The detection circuits 33 and 34 illustrated in FIG. 2 may be used in place of the detection circuits 33A and 34A.

When the data signal first changes after the state changes from the high-impedance state to the driving state, potential falling at the node Nd1 down to the voltage Vdd−Vthp or potential rising at the node Nd2 up to the voltage Vss+Vthn is performed at a high speed, thereby reducing a delay at transition start timing of the output signal OUT.

Figure 11:
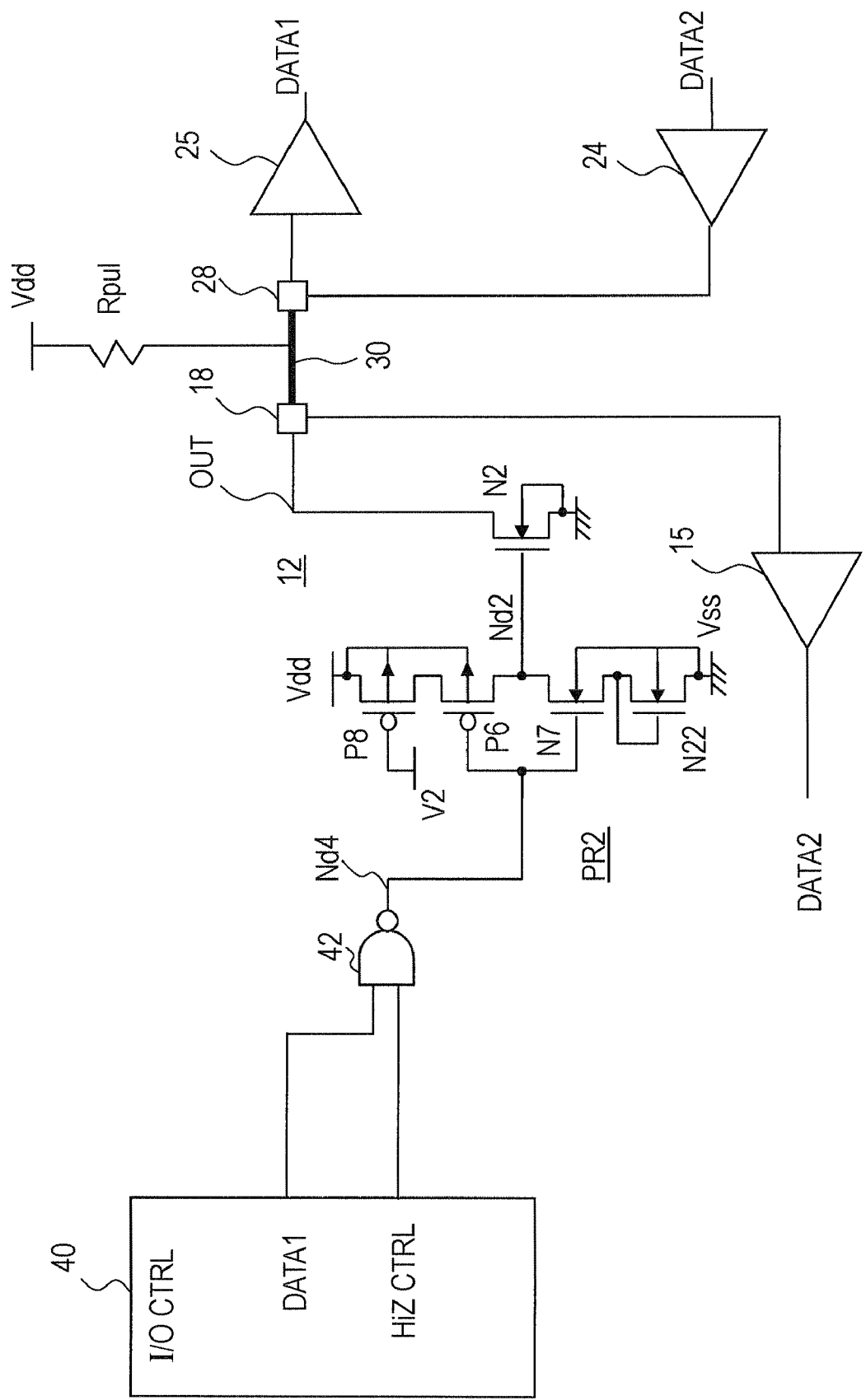
FIG. 11 illustrates an exemplary output driver circuit.

FIG. 11 illustrates an exemplary output driver circuit. The output driver circuit illustrated in FIG. 11 may be an output driver circuit applied to the I2C. In the I2C, an output terminal serves as an open drain. The output driver circuit illustrated in FIG. 11 may or may not include the transistor P1 and the pre-buffer circuit PR1 illustrated in FIG. 4, for example. In the output driver circuit illustrated in FIG. 11, the transmission line 30 is coupled to the supply voltage Vdd via a pull-up resistor Rpu1. Thus, when the transistor N2 is turned on, the output terminal OUT may change to a low level, and when the transistor N2 is turned off, the output terminal OUT may turn to a high level. Operations of the pre-buffer circuit PR2 and the transistor N2 may be substantially the same as or similar to those illustrated in FIG. 4.

Figure 12:
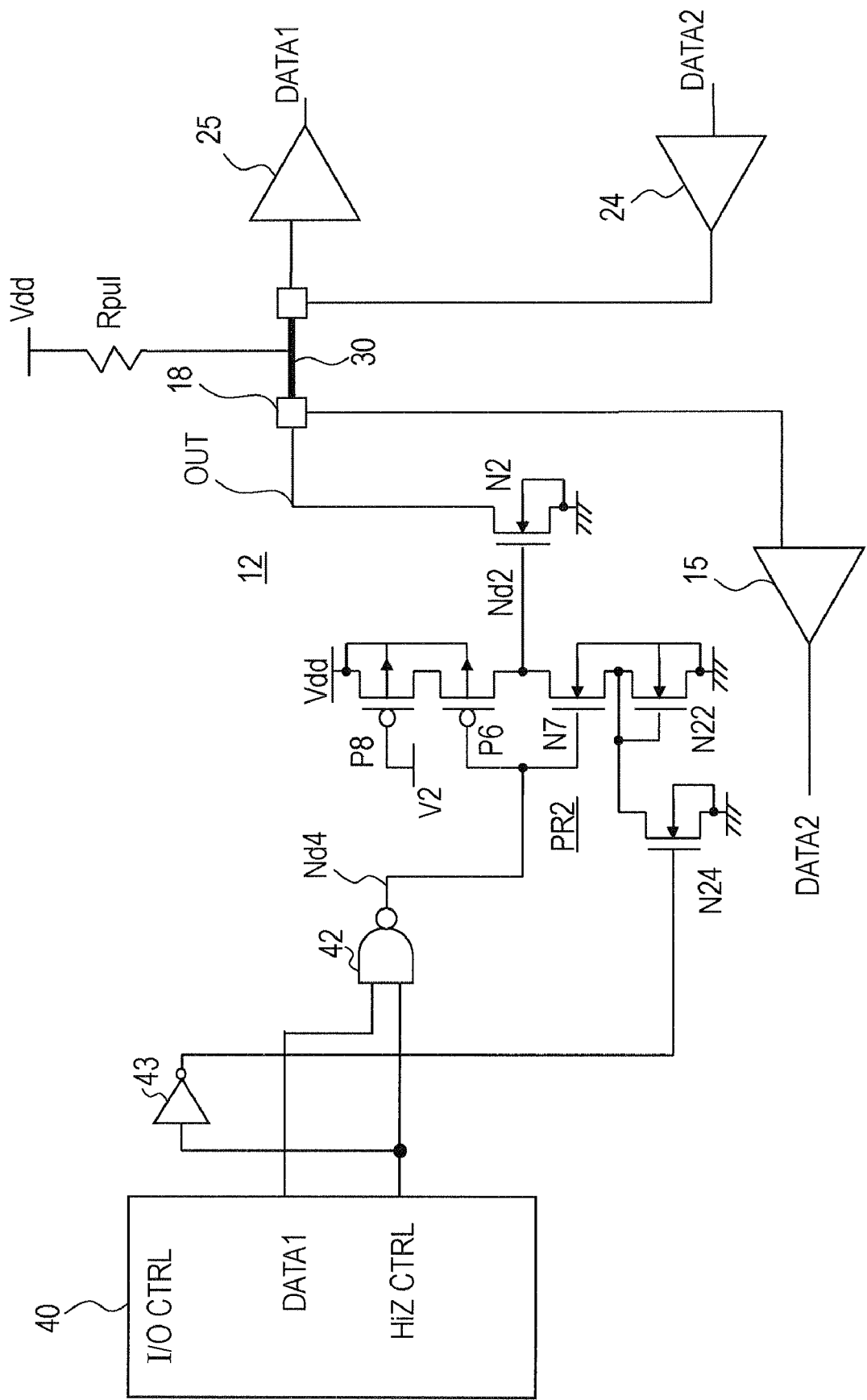
FIG. 12 illustrates an exemplary output driver circuit.

FIG. 12 illustrates an exemplary output driver circuit. The output driver circuit illustrated in FIG. 12 may be an output driver circuit applied to the I2C in FIG. 6, for example. The output driver circuit illustrated in FIG. 12 may or may not include a transistor P1 and the pre-buffer circuit PR1 similar to that illustrated in FIG. 6. The output driver circuit illustrated in FIG. 12 includes the pull-up resistor Rpu1. Operations of the pre-buffer circuit PR2 and the transistor N2 may be substantially the same as or similar to those illustrated in FIG. 6.

Figure 13:
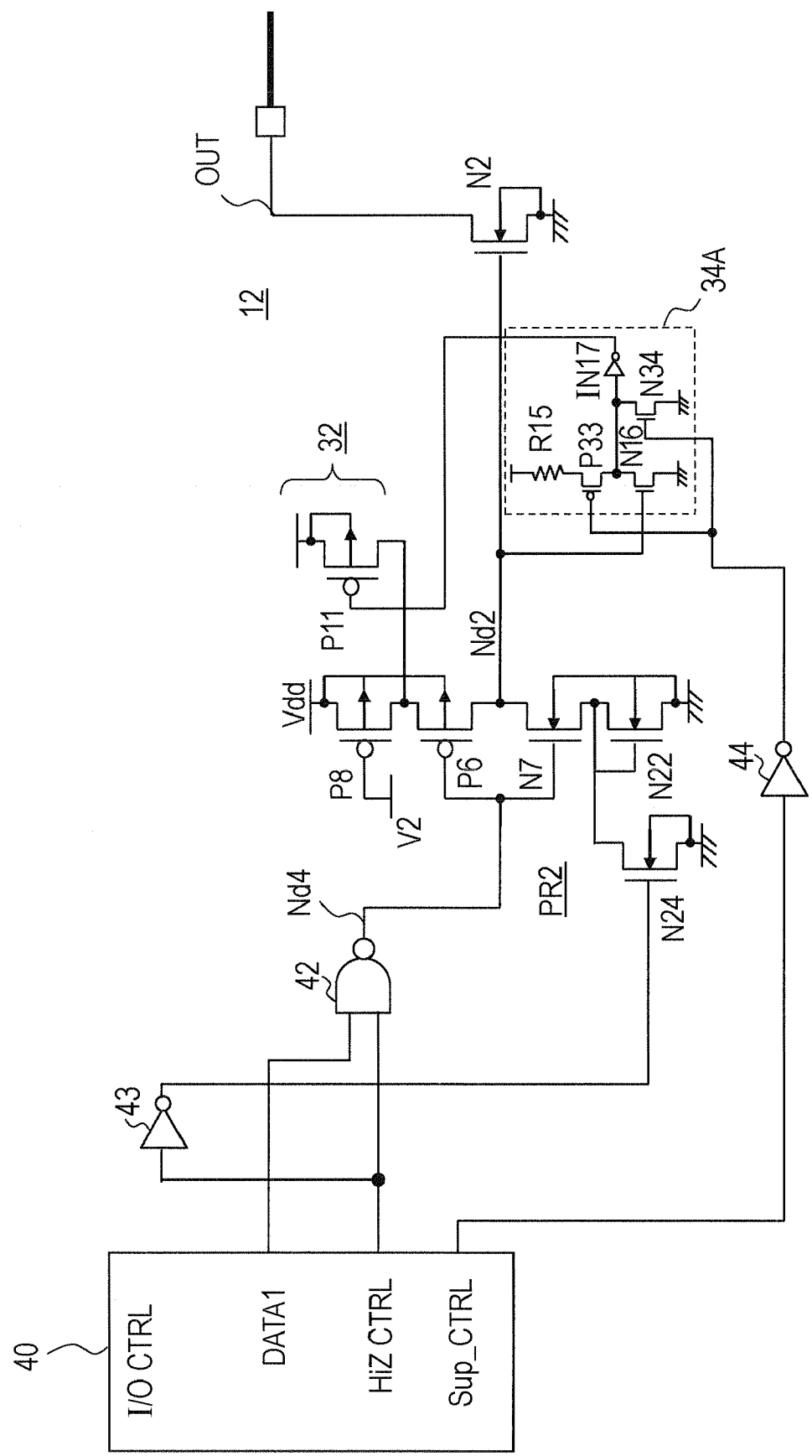
FIG. 13 illustrates an exemplary output driver circuit.

FIG. 13 illustrates an exemplary output driver circuit. The output driver circuit illustrated in FIG. 13 may be an output driver circuit applied to the I2C in FIG. 8, for example. The output driver circuit illustrated in FIG. 13 may or may not include a transistor P1 and a pre-buffer circuit PR1 similar to that illustrated in FIG. 8. The output driver circuit illustrated in FIG. 13 includes the pull-up resistor Rpu1. Operations of the pre-buffer circuit PR2 and the transistor N2 may be substantially the same as or similar to those illustrated in FIG. 8.

The output drive circuit illustrated in each of FIGS. 4, 6 and 8 may be applied to the I2C when it becomes an open-drain circuit by turning the output transistor P1 off.

Example aspects of the present invention have now been described in accordance with the above advantages. It will be appreciated that these examples are merely illustrative of the invention. Many variations and modifications will be apparent to those skilled in the art.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The invention claimed is:

1. A driver circuit comprising:
    an output transistor circuit that includes a first transistor of a first conductivity type and a second transistor of a second conductivity type disposed between a supply voltage source configured to supply a supply voltage and a reference voltage source configured to supply a reference voltage, wherein the output transistor circuit is configured to output an output signal from a connection node between the first transistor and the second transistor;
    a first pre-buffer circuit configured to drive a gate of the first transistor in response to an input signal; and
    a second pre-buffer circuit configured to drive a gate of the second transistor in response to the input signal,
    wherein the first pre-buffer circuit includes:

a third transistor of the first conductivity type and a fourth transistor of the second conductivity type, the third and fourth transistors being configured to receive the input signal and drive the gate of the first transistor;

a first current source disposed between the fourth transistor and the reference voltage source; and a fifth transistor of the first conductivity type is diode-coupled between the supply voltage source and the third transistor, and wherein the second pre-buffer circuit includes:

a sixth transistor of the first conductivity type and a seventh transistor of the second conductivity type, the sixth and seventh transistors being configured to receive the input signal and drive the gate of the second transistor;

a second current source disposed between the sixth transistor and the supply voltage source; and an eighth transistor of the second conductivity type is diode-coupled between the reference voltage source and the seventh transistor.

2. The driver circuit according to claim 1, wherein the first transistor and the second transistor are configured to be turned off when the output signal is at a high impedance, wherein the first transistor and the second transistor are configured to be controlled in accordance with the input signal when the output signal is driven, wherein the first pre-buffer circuit includes a ninth transistor of the first conductivity type that is disposed between the supply voltage source and the third transistor in parallel with the fifth transistor, the ninth transistor being configured to turn on when the output signal is at a high impedance and to turn off when the output signal is driven, and wherein the second pre-buffer circuit includes a tenth transistor of the second conductivity type that is disposed between the reference voltage source and the seventh transistor in parallel with the eighth transistor, the tenth transistor being configured to turn on when the output signal is at a high impedance and to turn off when the output signal is driven.

3. The driver circuit according to claim 2, wherein the gate of the first transistor is configured to be held at the supply voltage and the gate of the second transistor is configured to be held at the reference voltage when the output signal is at the high impedance.

4. The driver circuit according to claim 1, wherein the first transistor and the second transistor are configured to be turned off when the output signal is at a high impedance, and the first transistor and the second transistor are configured to be controlled in accordance with the input signal when the output signal is driven, wherein the first pre-buffer circuit includes:

a first auxiliary transistor of the second conductivity type disposed in parallel with the first current source; and a first detection circuit that is configured to turn the first auxiliary transistor on when a voltage at the gate of the first transistor falls from the supply voltage to a first voltage that is lower than the supply voltage by a threshold voltage of a transistor of the first conductivity type, and to turn the first auxiliary transistor off when a voltage at the gate of the first transistor falls to a second voltage lower than the first voltage, and wherein the second pre-buffer circuit includes:

a second auxiliary transistor of the first conductivity type disposed in parallel with the second current source; and a second detection circuit configured to turn the second auxiliary transistor on when a voltage at the gate of the second transistor rises from the reference voltage to a third voltage which is higher than the reference voltage by a threshold voltage of the transistor of the second conductivity type, and to turn the second auxiliary transistor off when the voltage at the gate of the second transistor increases to a fourth voltage higher than the third voltage.

5. The driver circuit according to claim 4, wherein the first detection circuit and the second detection circuit are configured to be activated to respectively control the first auxiliary transistor and the second auxiliary transistor when the output signal is driven and the input signal changes.

6. The driver circuit according to claim 5, wherein the first detection circuit and the second detection circuit are configured to respectively turn the first auxiliary transistor and the second auxiliary transistor off after the output signal is driven and the input signal changes.

7. The driver circuit according to claim 5, wherein the first detection circuit and the second detection circuit are configured to remain activated after the output signal is driven and the input signal changes.

8. The driver circuit according to claim 5, wherein the first detection circuit and the second detection circuit are configured to be inactivated when the output signal is at the high impedance and configured to be activated when the output signal is driven.

9. The driver circuit according to claim 1, wherein the first current source and the second current source include a current Miller circuit.

10. The driver circuit according to claim 1, wherein channels and sources of the first transistor and the fifth transistor are coupled to the supply voltage source, and channels and sources of the second transistor and the eighth transistor are coupled to the reference voltage source.

11. A driver circuit comprising:

an output transistor circuit that includes a first transistor of a first conductivity type and a second transistor of a second conductivity type disposed between a supply voltage source configured to supply a supply voltage and a reference voltage source configured to supply a reference voltage, the output transistor circuit being configured to output an output signal from a connection point between the first transistor and the second transistor;

a first pre-buffer circuit configured to drive a gate of the first transistor in response to an input signal;

a second pre-buffer circuit configured to drive a gate of the second transistor in response to the input signal;

a first diode-coupled transistor of the first conductivity type disposed on a supply voltage source side in the first pre-buffer circuit; and a second diode-coupled transistor of the second conductivity type disposed on a reference voltage source side in the second pre-buffer circuit, wherein channels and sources of the first transistor and the first diode-coupled transistor are coupled to the supply voltage source, and wherein channels and sources of the second transistor and the second diode-coupled transistor are coupled to the reference voltage source.

12. A driver circuit comprising:

an output transistor of a second conductivity type disposed between an output terminal and a reference voltage source configured to supply a reference voltage; and a pre-buffer circuit that drives a gate of the output transistor in response to an input signal,
wherein the pre-buffer circuit includes:
- a first transistor of a first conductivity type and a second transistor of the second conductivity type configured to receive the input signal and drive the gate of the output transistor;
- a current source disposed between the first transistor and a supply voltage source; and
- a third transistor of the second conductivity type diode-coupled between the reference voltage source and the second transistor.

13. The driver circuit according to claim 12, wherein
the output transistor is configured to be turned off when the output signal is at a high impedance, and is configured to be controlled based on the input signal when the output signal is driven, and
wherein the pre-buffer circuit includes:
- a fourth transistor of the second conductivity type disposed between the reference voltage source and the second transistor in parallel with the third transistor, the fourth transistor being configured to turn on when the output signal is at a high impedance and configured to be turned off when the output signal is driven.

14. The driver circuit according to claim 13, wherein
a gate of the output transistor is configured to be held at the reference voltage when the output signal is at the high impedance.

15. The driver circuit according to claim 12, wherein
the output transistor is configured to be turned off when the output signal is at a high impedance, and is configured to be controlled based on the input signal when the output signal is driven, and
wherein the pre-buffer circuit includes:
- an auxiliary transistor of the first conductivity type disposed in parallel with the current source; and
- a detection circuit configured to turn the auxiliary transistor on when a gate voltage of the output transistor rises from the reference voltage to a first voltage, which is higher than the reference voltage by a threshold voltage of the second conductivity type transistor, and to turn the auxiliary transistor off when the gate voltage of the output transistor rises higher than the first voltage.

16. The driver circuit according to claim 15, wherein
the detection circuit is configured to be activated to control the auxiliary transistor when the output signal is driven and the input signal changes.

17. The driver circuit according to claim 16, wherein
the detection circuit is configured to turn the auxiliary transistor off after the output signal is driven and the input signal changes.

18. The driver circuit according to claim 16, wherein
the detection circuit is configured to remain activated after the output signal is driven and the input signal changes.

* * * * *